(12) United States Patent
Park et al.

(10) Patent No.: US 7,298,452 B2
(45) Date of Patent: Nov. 20, 2007

(54) PATTERNING APPARATUS AND METHOD FOR FABRICATING CONTINUOUS PATTERN USING THE SAME

(75) Inventors: Suk-Ho Park, Seoul (KR); Young-Jun Choi, Seoul (KR); Hyeon-Seok Oh, Suwon (KR); Jae-Ha Lim, Osan (KR); Suk-Won Jung, Osan (KR)

(73) Assignees: LG Electronics Inc., Seoul (KR); Korea Electronics Technology Institute, Seoul (KR)

( * ) Notice: Subject to any disclaimer, the term of this patent is extended or adjusted under 35 U.S.C. 154(b) by 169 days.

(21) Appl. No.: 10/992,335

(22) Filed: Nov. 19, 2004

(65) Prior Publication Data

US 2005/0151944 A1    Jul. 14, 2005

(30) Foreign Application Priority Data

Dec. 16, 2003    (KR) ............... 10-2003-0091997

(51) Int. Cl.
G03B 27/62    (2006.01)
G03B 27/58    (2006.01)

(52) U.S. Cl. .................................. 355/47; 355/72

(58) Field of Classification Search .......... 355/47, 355/53, 72
See application file for complete search history.

(56) References Cited

U.S. PATENT DOCUMENTS 4,206,965 A * 6/1980 McGrew ................ 359/9
5,652,645 A * 7/1997 Jain ..................... 355/53
6,222,157 B1 * 4/2001 Langille et al. ........ 219/121.69

FOREIGN PATENT DOCUMENTS

JP    4-359465 A    12/1992
JP    10-256476 A    9/1998

* cited by examiner

Primary Examiner—Henry Hung Nguyen
(74) Attorney, Agent, or Firm—Birch, Stewart, Kolasch & Birch, LLP

(57) ABSTRACT

A flexible substrate, which has a photosensitive agent applied thereon, is continuously supplied from a supply unit to a guide unit where light is irradiated from a light source on a section of the substrate. A mask is positioned between the substrate and the light source so that the light from the light source selectively subjects the section of the substrate to exposure. Hence, it is possible to form a pattern having a continuous slanted structure for a large-area display panel.

20 Claims, 8 Drawing Sheets

PATTERNING APPARATUS AND METHOD FOR FABRICATING CONTINUOUS PATTERN USING THE SAME

The present application claims, under 35 U.S.C. § 119, the priority benefit of Korean Patent Application No. P03-091997 filed Dec. 16, 2003 in Republic of Korea, the entire contents of which are herein fully incorporated by reference.

BACKGROUND OF THE INVENTION

1. Field of the invention

The present invention relates to a patterning apparatus and a patterning method using the same, and more particularly to an apparatus for fabricating a pattern of a continuous structure, which is used in a large-area display, and a method for fabricating a pattern of a continuous structure using the same.

As used herein, the pattern of a continuous structure refers to a pattern of, e.g., barrier ribs of a Plasma display panel (PDP), which are arranged in line in one direction with a uniform cross section.

2. Description of the Related Art

Conventional patterning methods include an electron beam lithography method, an optical lithography method, and an X-ray lithography method.

According to the electron beam lithography method, a photosensitive agent, which reacts to electrons, is applied on the upper surface of a substrate and a predetermined pattern is directly etched using electron beams, without any mask. This method can form a high-resolution pattern of 0.2 μm or less, since the electrons have a short wavelength.

However, it takes a long time to etch a predetermined pattern using the electron beam lithography method. This decreases productivity. In addition, since the depth of a formed pattern is small, the accuracy of overlay and etching is poor. Furthermore, the method uses expensive electron-emission equipment. Consequently, the electron beam lithography method is not suitable for fabricating a pattern for use in a large-area display panel.

According to the optical lithography method, a photosensitive agent is applied on the upper surface of a substrate, a mask is placed thereon, and UV rays are irradiated to fabricate a predetermined pattern. This method can form a vertical or slanted pattern according to the irradiation angle of the UV rays.

However, if the optical lithography method is used, it is difficult to fabricate a vertical pattern with a thickness of a few tens of μm or more, as well as to form a uniformly slanted pattern, due to the diffraction characteristics peculiar to the UV rays. In addition, since the UV rays have dispersion, they cannot be irradiated only on selected portions or form a micro-pattern with a line width of 0.2 μm or less. Accordingly, this method cannot form a highly-integrated pattern.

According to an X-ray lithography method, a photosensitive agent is applied on the upper surface of a substrate and X-rays are irradiated via a mask to fabricate a predetermined pattern. Since the X-rays have a short wavelength, this method can form a micro-structure with a line width of 0.1 μm or less.

However, when a substrate 1 and a mask 2 are kept parallel to each other and X-rays are irradiated with a slant to form a pattern 1a of a slanted structure, as shown in FIG. 1, a problem occurs as follows:

If the mask 2 is positioned with a slant relative to the X-rays, there is a difference in the traveling distance $L_1, L_2$ of the X-rays to the absorbent body 2b of the mask 2. This decreases the degree of precision in shape. In order to solve this problem, the mask 2 should have a trapezoid absorbent body, which is difficult to fabricate. Since the width d of the X-rays is not zero, it is also impossible to form a continuous pattern.

In addition, when the substrate 1 and the mask 2 are retained parallel to each other and X-rays are irradiated vertically to form a pattern 1a of a slanted structure, as shown in FIG. 2, a problem occurs as follows:

If the X-rays are irradiated on the upper surface of the substrate 1, a thickness T of a photosensitive agent, which has been applied on the upper surface of the substrate, is subject to exposure as far as they penetrate into the substrate. Accordingly, this method can form only a pattern 1a of a thickness T of tens or hundreds of μm, which corresponds to the thickness of the substrate. In other words, such a conventional vertical irradiation method cannot continuously form a pattern of a three-dimensional slanted structure having a predetermined thickness or more.

SUMMARY OF THE INVENTION

Accordingly, the present invention has been made to solve one or more of the above-mentioned problems occurring in the prior art, and an object of the present invention is to provide a patterning apparatus capable of forming a pattern in a relatively large area of substrate and a patterning method using the same.

Another object of the present invention is to provide a patterning apparatus capable of fabricating a highly-integrated pattern and a patterning method using the same.

Another object of the present invention is to provide a patterning apparatus capable of fabricating a continuous pattern and a patterning method using the same.

Another object of the present invention is to provide a patterning apparatus capable of continuously fabricating a pattern of a slanted structure of a predetermined thickness or more and a patterning method using the same.

In order to accomplish one or more of the above objects, there is provided a patterning apparatus comprising: a guide unit for continuously guiding a flexible substrate, which has a photosensitive agent applied thereon, in a predetermined region including the top point of the guide unit; a light source for vertically irradiating beams on a vertical section of the photosensitive agent, which has been applied on the substrate; and a mask positioned between the substrate, which is guided by the guide unit, and the light source so that the beams are selectively transmitted to the photosensitive agent.

The guide unit can be a roller of a cylindrical shape and an auxiliary guide unit, which corresponds to the guide unit, is additionally provided so that the substrate is guided while being forced against the guide unit.

The guide unit is directly driven by a driving motor to move and guide the substrate.

The patterning apparatus further comprises a supply unit for supplying the substrate to the guide unit and a winding unit for collecting the substrate, which has been subject to exposure in the guide unit, both of the supply and winding units providing driving power to move the substrate.

The guide unit and the mask are installed on a frame and the mask is positioned by an alignment controller unit, which is provided on the frame.

The guide unit and the mask are installed on a frame and the guide unit is positioned by a guide unit adjustment unit, which is provided on the frame.

According to another aspect of the present invention, there is provided a patterning apparatus comprising: a supply unit for continuously supplying a flexible substrate, which has a photosensitive agent applied thereon; a guide unit fixedly installed and adapted to continuously guide the substrate, which is supplied from the supply unit, in a predetermined region including the top point of the guide unit; a light source for vertically irradiating beams on a vertical section of the substrate, which is positioned on the top point of the guide unit; a mask positioned between the substrate, which is guided by the guide unit, and the light source so that the beams are selectively transmitted to the photosensitive agent; and a winding unit for collecting and winding the substrate, which has been subject to exposure in the guide unit.

The guide unit has a curved surface formed at least from its supply unit side to its top point, which contacts the substrate and guides it.

The guide unit has a flat surface formed in a predetermined region from its top point to its winding unit side, which contacts the substrate and guides it.

The guide unit and the mask are installed on a frame and the mask is positioned by an alignment controller unit, which is provided on the frame.

The guide unit and the mask are installed on a frame and the guide unit is positioned by a guide unit adjustment unit, which is provided on the frame.

According to still another aspect of the present invention, there is provided a patterning method wherein a flexible substrate, which has a photosensitive agent applied on its surface, is supplied from a supply unit; is collected by a winding unit; is contacted by a predetermined region of a guide unit, including at least its top point, between the supply and winding units; and is guided, the method comprising: a first step of continuously guiding the substrate from the supply unit to the predetermined region of the guide unit, including its top point; a second step of irradiating beams from a light source in a direction perpendicular to a vertical section of the photosensitive agent, which is positioned on the top point of the guide unit, via a mask; and a third step of collecting the substrate, which has been subject to exposure in the guide unit, from the guide unit to the supply unit.

The mask is positioned parallel to the vertical section and the beams are vertically irradiated on the mask.

The period of time during which the beams are irradiated on the photosensitive agent and the amount of irradiation are determined by a speed control, which guides and moves the substrate.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Figure 1:
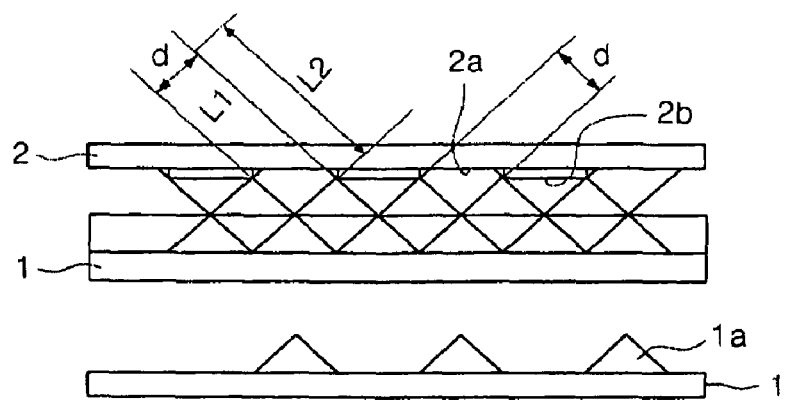
FIG. 1 shows a patterning process employing a slanted irradiation method in accordance with the background art.
Figure 2:
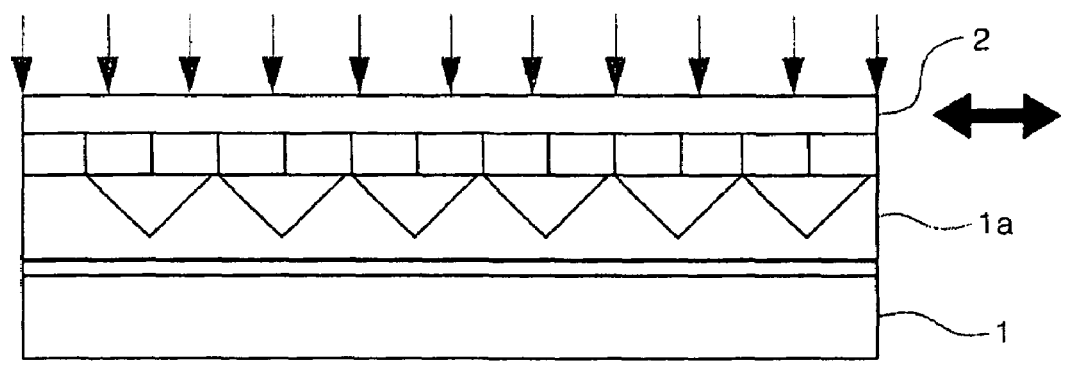
FIG. 2 shows a patterning process with a vertical irradiation method in accordance with the background art.

Hereinafter, a preferred embodiment of the present invention will be described with reference to the accompanying drawings. In the following description and drawings, the same reference numerals are used to designate the same or similar components, and so repetition of the description on the same or similar components will be omitted.

Figure 3:
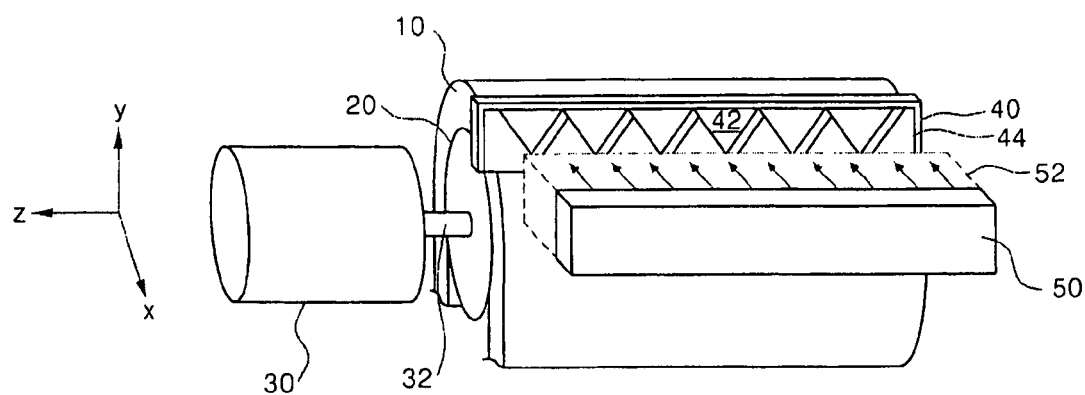
FIG. 3 shows the outline of a first embodiment of a patterning apparatus according to the present invention.
Figure 4A:
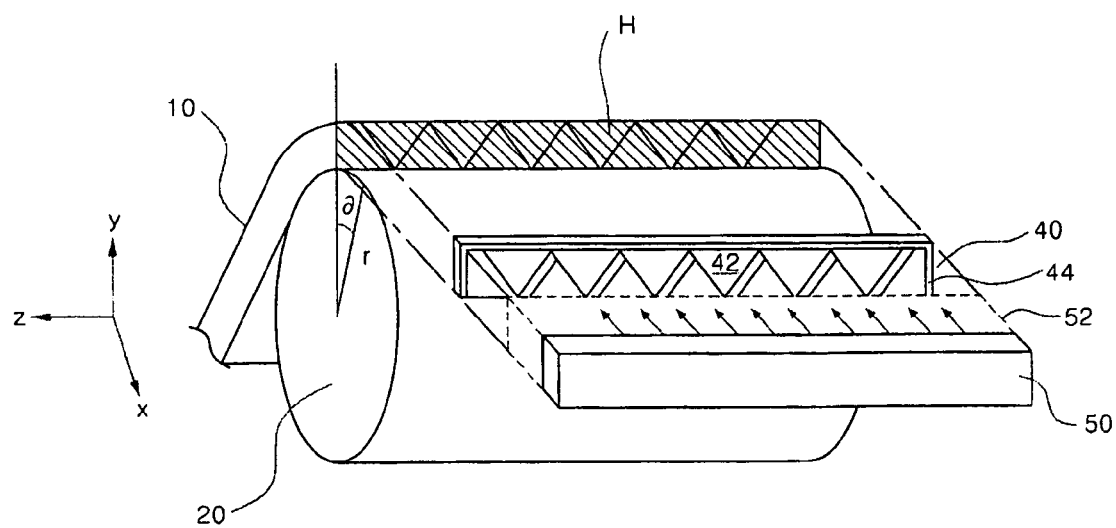
FIGS. 4a and 4b show the principal parts of FIG. 3 for explaining the concept of the present invention.
Figure 4B:
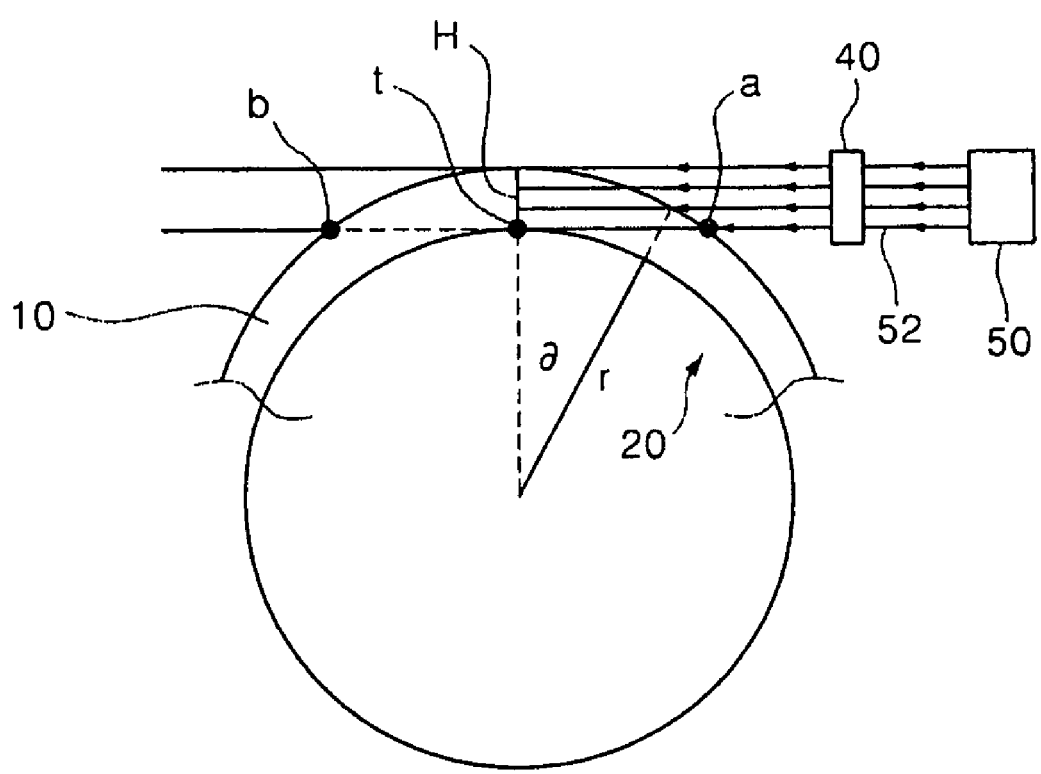

FIG. 3 shows the outline of a first embodiment of a patterning apparatus according to the present invention and FIGS. 4a and 4b show the principal parts of FIG. 3 for explaining the concept of the present invention.

As shown, a predetermined region of a flexible substrate 10, which has a photosensitive agent applied on its surface, is wound around a guide unit 20, which has a shape of a cylindrical roller, and is guided. The guide unit 20 is rotated by a driving motor 30. The driving motor 30 has a rotation shaft 32, which is concentrically connected to the rotation center of the guide unit 20 to rotate it. For reference, the rotation direction of the guide unit 20 is not necessarily identical to the movement direction of the substrate 10 and, for example, may be opposite to the movement direction of the substrate 10.

A mask 40 is positioned adjacently to the guide unit 20 and is parallel to the normal direction Z of the guide unit 20. The mask 40 is composed of an opening 42, through which beams 52 from a light source 50 (described below) pass, and an absorption unit 44, which absorbs the beams 52. The opening 42 is formed in such a manner that its shape corresponds to the sectional shape of a pattern to be formed and the absorption unit 44 forms a vertical wall around the opening 42. The mask 40 may also be provided with a cover (not shown) to selectively shield the opening 42.

A light source 50 is positioned in a location spaced a predetermined distance from the mask 40. The light source 50 provides beams 52, which are irradiated on the photosensitive agent to form a pattern. In other words, the beams 52 from the light source 52 pass through the opening 42 of the mask 40 and are irradiated on the photosensitive agent of the substrate, which is wound around the guide unit 20. In the present embodiment, the light source 50 emits X-rays, which travel in an exactly straight line, have very little dispersion, and have energy tens of thousands of times larger than other rays.

It will now be explained how the photosensitive agent on the substrate 10 is subject to exposure, with reference to FIGS. 4a and 4b. If the substrate is cut parallel to the Z axis through the center of the guide unit 20, a yz section is obtained in a location corresponding to the top point of the guide unit 20. Hereinafter, this section will be referred to as a "vertical section H".

According to the present invention, the beams 52 are irradiated vertically on the vertical section H to subject the photosensitive agent to exposure. In particular, by irradiating the beams 52 on the vertical section H without interruption, while the substrate 20 is continuously moved, a region is subject to exposure at points to which the beams 52 are transmitted, as shown in FIG. 4b.

More theoretically, as a vertical section H, which has been subject to exposure, is moved along the circumstance of the guide unit 20, the next vertical section H is positioned on the top point t of the guide unit 20 for exposure. As such, the photosensitive agent is divided into innumerable vertical sections H, which are subject to exposure successively.

In practice, part "a" of the photosensitive agent is initially subject to exposure. If the substrate 10 is moved and passes through the top point t of the guide unit, the entire vertical section H is subject to exposure. Of course, if the beams 52 can pass through the photosensitive agent even at the location where the substrate has passed the top point t, point "b" will be the last portion to be subject to exposure.

The period of time during which the photosensitive agent of the substrate 10 is subject to exposure can be calculated by multiplying the radius r of the guide unit 20 by the rotation angle $\partial$ of the guide unit 20.

The mask 40 is preferably positioned parallel to the vertical section H. When passing through the opening 42 of the mask 40, the beams 52 should be vertically incident on the vertical section H.

Figure 5:
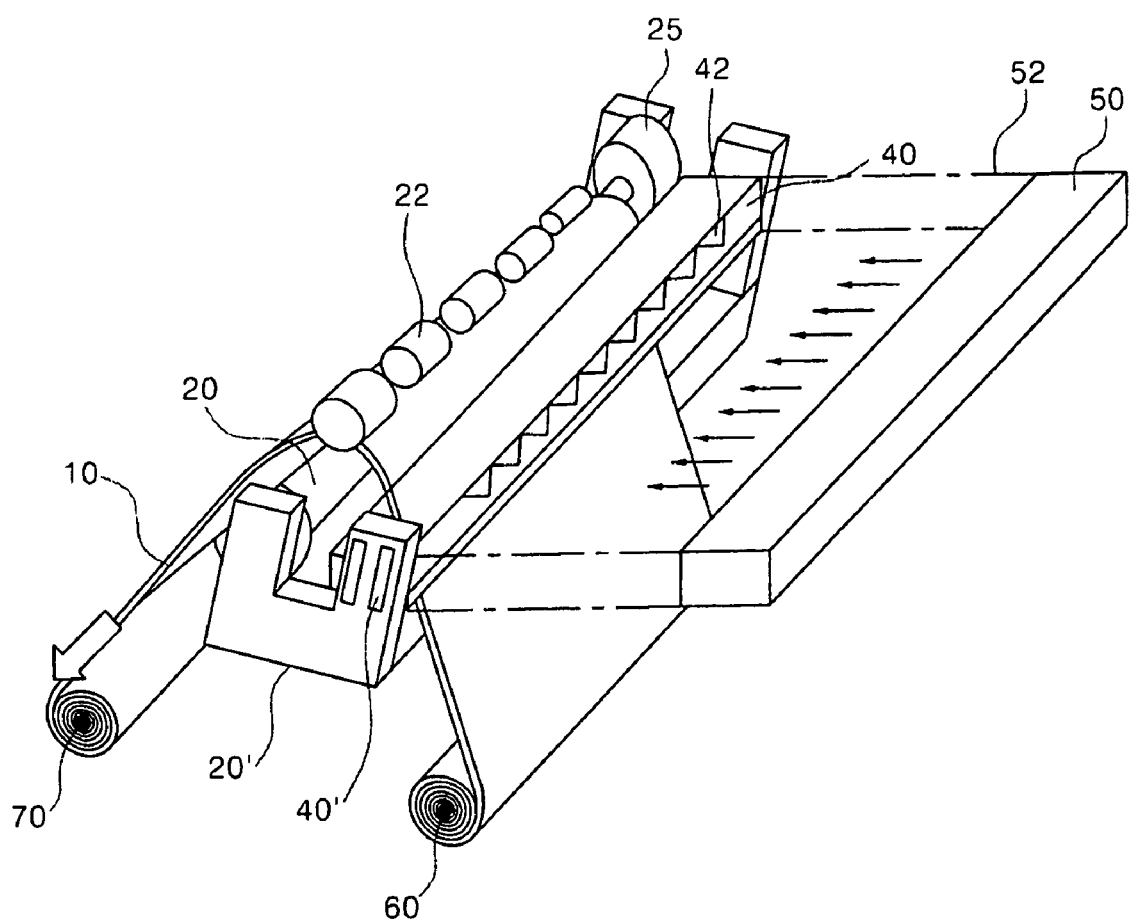
FIG. 5 shows a second embodiment of the present invention.

FIG. 5 shows a second embodiment of the present invention. For clarity, the same components as in the first embodiment are given the same reference numerals and repeated explanation thereof will be omitted.

As shown in the drawing, a guide unit 20 is positioned on a frame 20' together with a mask 40 to guide a substrate 10, in the present embodiment. The guide unit 20 is a cylindrical roller and contacts a predetermined region of the substrate 10 to guide it. An auxiliary guide unit 22, which corresponds to the guide unit 20, is provided. The auxiliary guide unit 22 cooperates with the guide unit 20 to guide the movement of the substrate 10.

The auxiliary guide unit 22 is rotated together with the guide unit 20 and securely forces the moving substrate 10 against the upper surface of the guide unit 20. In other words, the auxiliary guide unit 22 prevents the substrate 10 from being spaced from the upper surface of the guide unit 20 so that the beams 52 are accurately irradiated on the vertical section H.

The auxiliary guide unit 22 is not necessarily positioned adjacently to the guide unit 20, as shown in the drawing. For example, one auxiliary guide unit 22 is positioned on a side of the guide unit 20 where the substrate 10 is supplied and another is positioned on a side where the substrate 10 is collected. The region of the substrate 10, which contacts the guide unit 20 and is guided thereby, depends on the difference in location between the auxiliary guide unit 22 and the guide unit 20, as well as the height of the auxiliary guide unit 22.

The guide unit 20 may be driven by a driving motor, as in the previous embodiment. To this end, the driving motor may be positioned on a side of a frame 20'. If a driving motor is used, driving control may be necessary to control the rotation speed of the driving motor, so that the traveling speed of the substrate 10 can be controlled.

Meanwhile, it is not mandatory to provide the frame 20' with a driving motor, which supplies driving power to move the substrate 10. In other words, a separate driving source may provide the driving power to move the substrate 10, while the guide unit 20 is simply rotated together with the substrate 10 and guides it. Such a configuration will be described later in relation to a supplying unit 60 and a winding unit 70.

The guide unit 20 may be positioned along the longitudinal direction of the frame 20', that is, along a direction perpendicular to the moving direction of the substrate 10. To this end, a guide unit controller unit 25 is positioned on the frame 20' and the guide unit 20 is supported thereby.

The mask 40 is supported on the frame 20' by an alignment controller unit 40'. The alignment controller unit 40' is adapted to adjust the mask 40 precisely. The alignment controller unit 40' plays the role of aligning the mask 40 parallel to the vertical section H of the photosensitive agent, which has been applied on the substrate 10.

A feature is preferably provided to align the light source 50 relative to the mask 40. In particular, the light source 50 is preferably positioned so that the light, which is irradiated from the light source 50, is accurately incident on the vertical section H via the mask 40.

Meanwhile, a feature is provided to continuously supply the substrate 10 to the guide unit 20 and continuously collect the substrate 10, which has been subject to exposure. In particular, the substrate 10 is wound into a roll form and placed in a supply unit 60. The substrate 10 is then continuously unwound and supplied to the guide unit. A winding unit 70 is also provided to wind the substrate, which has been subject to exposure, into a roll form and collect it from the guide unit 20. Alternatively, the substrate, which has been subject to exposure, may be continuously supplied to the next process and wound on the winding portion 70, after the pattern formation is over.

To this end, the winding unit 70 should exert a drawing force to wind the substrate 10. In that case, the winding unit 70 acts as a driving source. Of course, another driving source may be positioned on the moving path of the substrate 10 to move the substrate 10.

Figure 6:
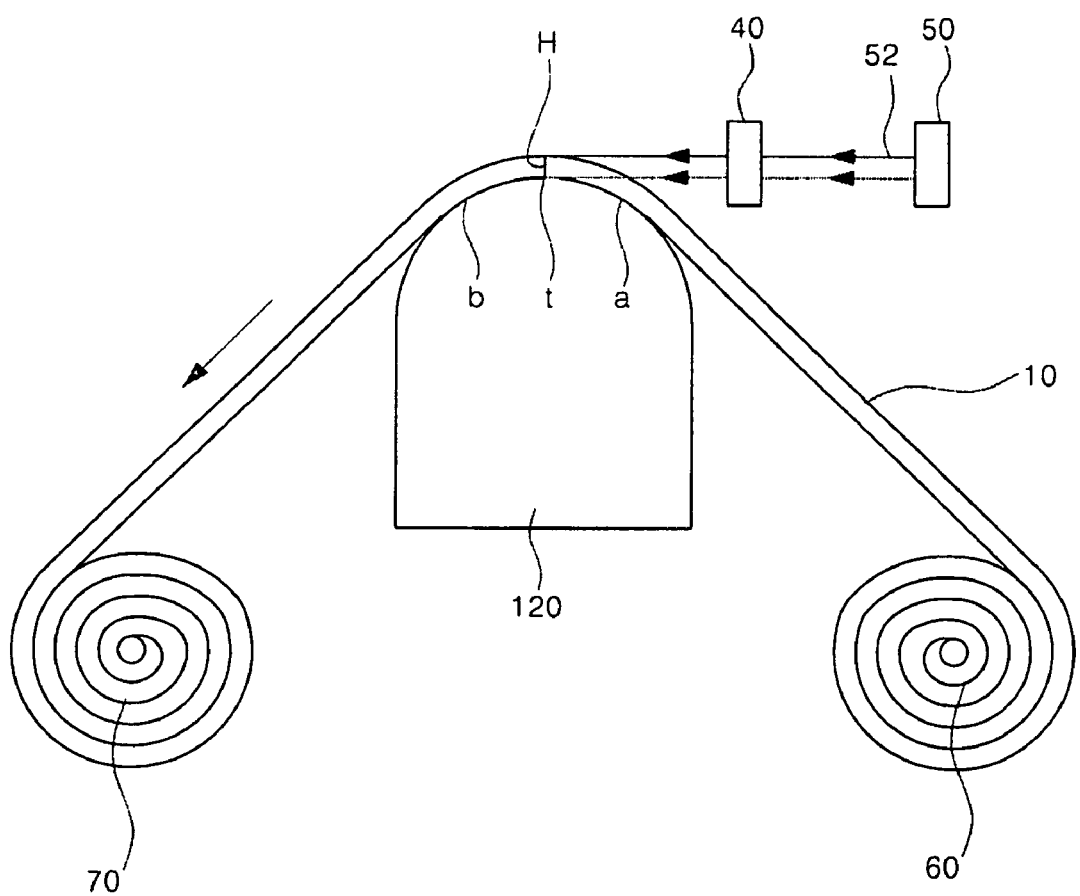
FIG. 6 shows a third embodiment of the present invention.

FIG. 6 shows a third embodiment of the present invention. For clarity, the same components as in the previous embodiment are given the same reference numerals and repeated explanation thereof will be omitted.

In the present embodiment, a guide unit 120, which guides a substrate 10, is not rotated but fixed. The guide unit 120 does not need to have a curved surface anywhere but in a region adjacent to the top point t thereof, which contacts the substrate 10 and guides it. Except for this detail, the guide unit 120 may be arbitrarily configured.

Figure 6A:
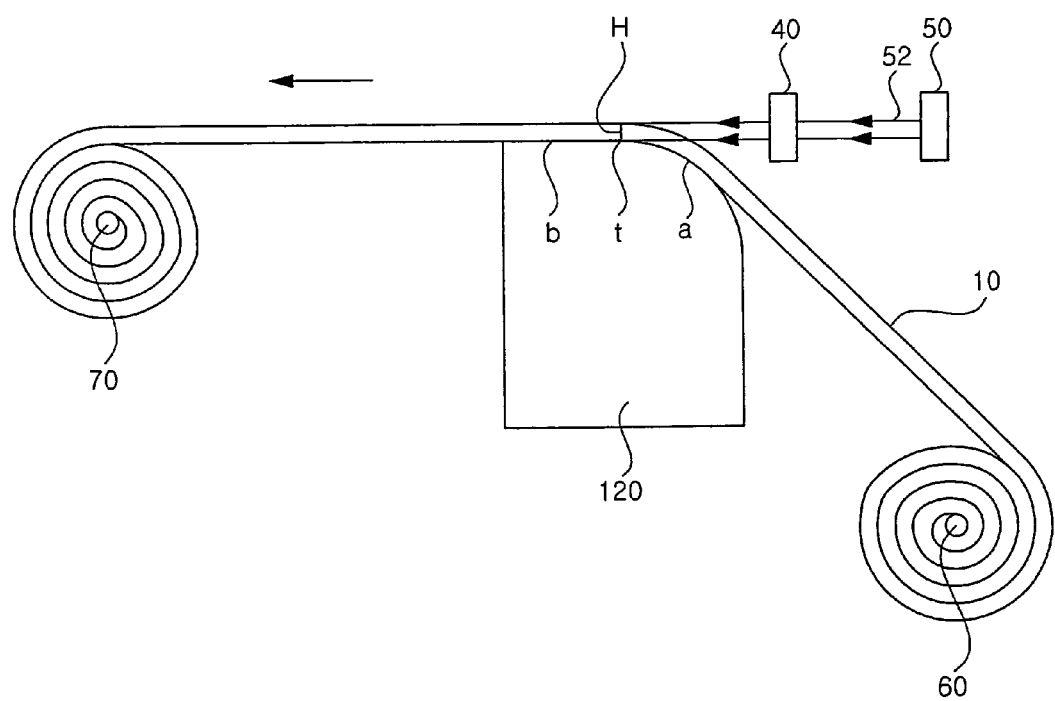
FIG. 6a shows a variation of the third embodiment in FIG. 6.

For reference, as shown in FIG. 6a, the region from point "a" to the top point t is preferably composed of a curved surface, while the region from the top point "t" to point "b" may be composed of a flat surface. In that case, it is possible to modify the period of time during which the photosensitive agent is subject to exposure, by adjusting the length of the flat surface region.

Although not shown in the drawing, the guide unit 120 may be provided with an auxiliary guide unit, which forces the moving substrate 10 against the guide unit 120.

As such, in the present embodiment, the guide unit 120 is fixed and just guides the movement of the substrate 10. Accordingly, a supply unit 60 and a winding unit 70 provide the power necessary for the movement of the substrate 10.

The supply unit 60 continuously supplies the substrate 10, while the winding unit 70 pulls and winds the substrate 10. Therefore, the winding unit 70 acts as a driving source. Of course, a separate driving source may be positioned in the movement path of the substrate 10 to provide the driving power to move the substrate 10.

A mask 40 is positioned parallel to the vertical section H of the substrate 10 so that beams 52 are selectively irradiated on the vertical section H. The configuration of the mask 40 is the same as in the previous embodiment. The beams 52, which are irradiated on the substrate 10, are provided from a light source 50. A feature may also be provided to align the mask 40.

Figure 7:
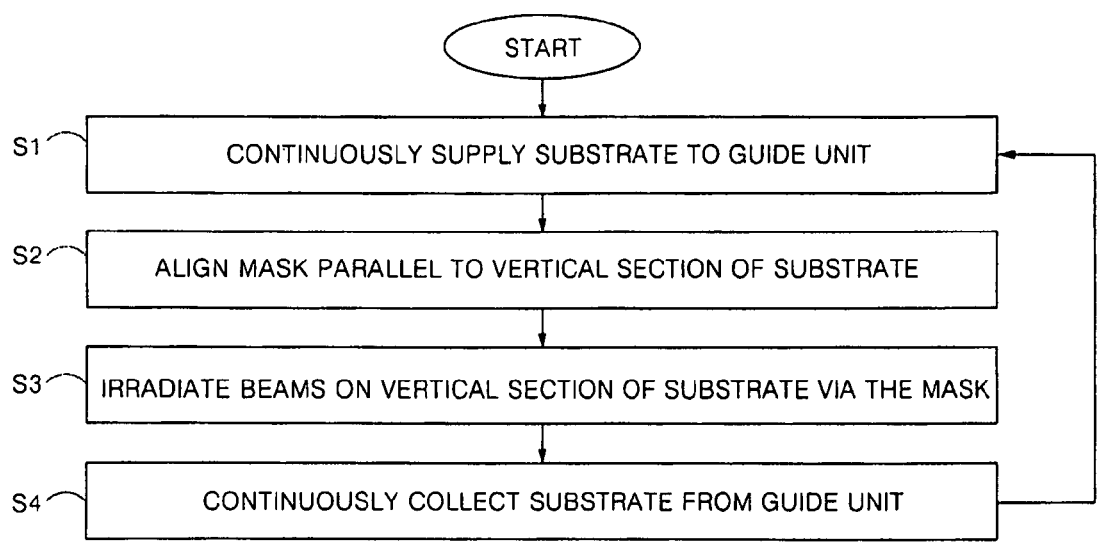
FIG. 7 shows a flow chart of a patterning method according to the present invention.

A patterning method using a patterning apparatus, configured as above, according to the present invention will now be described in detail with reference to the flow chart shown in FIG. 7.

A substrate 10, which has a photosensitive agent applied on its surface, is continuously supplied between a guide unit 20 and an auxiliary guide unit 22 (step 1). The substrate 10 is moved while contacting a surface of the guide unit 20. The auxiliary guide unit 22 plays the role of forcing the substrate 10 against the surface of the guide unit 20.

An alignment controller unit 40' is used to accurately position a mask 40 so that beams 52, which are irradiated from a light source 50, are correctly transmitted to a vertical section H (step 2). Of course, the light source 50 should be correctly positioned relative to the mask 40 or the guide unit 20.

The light source 50 irradiates beams 52, while the substrate 10 is moved and guided by the guide unit 20. The beams 52 pass through an opening 42 of the mask 40 and subject the photosensitive agent of the substrate 10 to exposure with a shape corresponding to that of the opening 42 (step 3).

As such, while the substrate 10 is continuously supplied to the guide unit 20, the beams 52, which are provided from the light source 50, continuously pass through the mask 40 and are irradiated on the vertical section H of the substrate 10. Accordingly, the photosensitive agent is continuously subject to exposure and a continuous pattern is formed.

The period of time during which the photosensitive agent is subject to exposure or a necessary amount of exposure may be obtained by calculation. Of course, the exposure period or the exposure amount should be modified according to the type of the photosensitive agent or the beams 52. The exposure period or the exposure amount may be controlled based on the speed of the substrate 10, which is moved and guided by the guide unit 20.

After the photosensitive agent is subject to exposure in the guide unit 20, the substrate 10 is again wound into a roll form (step S4). Of course, the steps for supply, collection, and exposure of the substrate 10, among other steps, are performed simultaneously and continuously, once they are begun.

Several steps should be performed additionally, including removing the photosensitive agent from parts, which have been subject to exposure, or from parts, which have not, to complete a pattern on the photosensitive agent, which has been subject to exposure through the above processes.

Figure 8A:
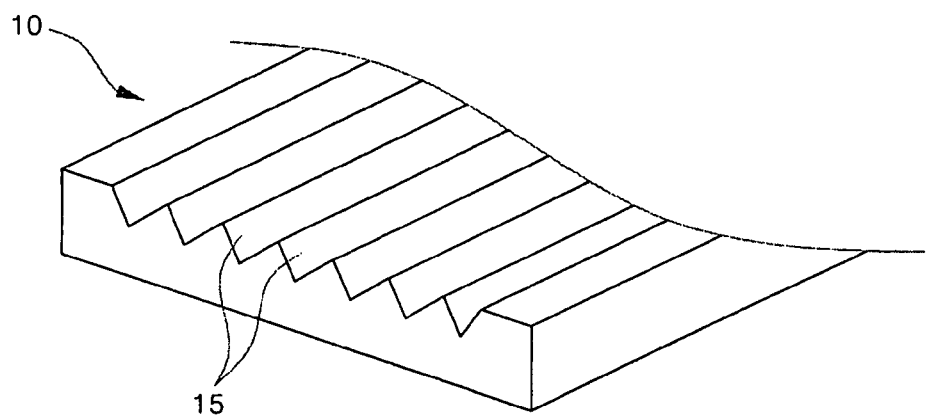
FIGS. 8a to 8c show examples of a three dimensional structure, which can be fabricated according to the present invention.
Figure 8B:
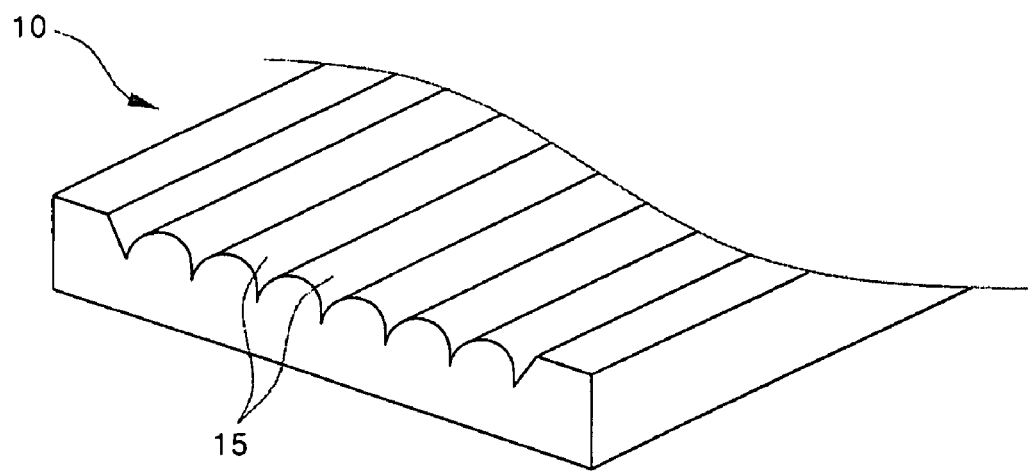
Figure 8C:
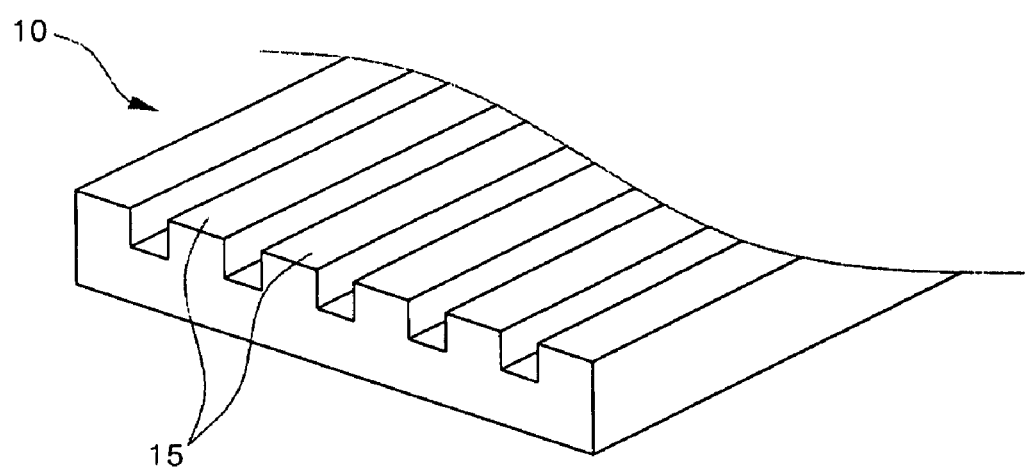

FIGS. 8a to 8c present examples of patterns 15, which have been formed on a substrate 10 according to a method of the present invention. Needless to say, the inventive method can form patterns having various sectional shapes, besides the patterns 15 shown in FIGS. 8a to 8c.

In summary, the basic technological idea of the present invention is as follows: beams 52 are vertically irradiated on a vertical section H of a substrate 10, which is continuously supplied along the outer peripheral surface of a guide unit 20 and through the top point t thereof, so that patterns of various sectional shapes can be fabricated in a continuous manner.

As mentioned above, the patterning apparatus and the patterning method according to the present invention are advantageous in that a pattern of a predetermined sectional shape can be formed in a relatively large area and thus a pattern for a large-area display can be fabricated easily.

Based on a completed pattern, beams are irradiated from a lateral surface, not from a top surface, of the pattern. This minimizes the spacing between patterns and enables the fabrication of a micro-pattern. Accordingly, it is possible to fabricate a highly-integrated pattern.

The lateral irradiation also makes it possible to continuously fabricate patterns having the same sectional shape. This reduces the process time for forming patterns and improves production efficiency.

Furthermore, the lateral irradiation makes it relatively easy to adjust the height of the patterns. Accordingly, patterns of various heights can be fabricated. Since the beams are irradiated on the upper and lower portions of a pattern at the same time, the upper and lower portions are subject to the same amount of exposure. This makes the width of the pattern uniform.

Although a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. A patterning apparatus comprising:
    a guide unit for continuously guiding a flexible substrate, which has a photosensitive agent applied thereon, wherein said guide unit is a roller having a cylindrical shape;
    a light source for irradiating beams on a section of the photosensitive agent, which has been applied on the substrate;
    a mask positioned between the substrate, which is guided by said guide unit, and said light source so that the beams are selectively transmitted to the photosensitive agent; and
    an auxiliary guide unit located beside and spaced from said guide unit, so that the substrate is guided while being forced against said guide unit,
    wherein said guide unit presents a curved surface over which the flexible substrate with the photosensitive agent passes while being irradiated by said light source.

2. The patterning apparatus according to claim 1, wherein the flexible substrate passes over a top point of said guide unit while being irradiated by said light source.

3. The patterning apparatus according to claim 1, wherein a vertical section of the flexible substrate with the photosensitive agent is irradiated by beams of said light source which are approximately perpendicular to the vertical section.

4. The patterning apparatus according to claim 1, wherein said roller is directly or indirectly driven by a driving motor to rotate in a same direction or an opposite direction as a movement direction of the substrate.

5. The patterning apparatus according to claim 1, further comprising:
    a supply unit for supplying the substrate to said guide unit; and
    a winding unit for collecting the substrate, which has been subject to exposure as it passes by said guide unit, wherein at least one of said supply and winding units provides driving power to move the substrate.

6. The patterning apparatus according to claim 1, wherein said guide unit and said mask are installed on a frame.

7. The patterning apparatus according to claim 6, further comprising:
    an alignment controller unit for controlling an alignment of said mask.

8. The patterning apparatus according to claim 6, further comprising:

an guide unit adjustment unit for controlling a position of said guide unit.

9. The patterning apparatus according to claim 1, wherein said light source emits x-rays.

10. A patterning apparatus comprising:
   a supply unit for continuously supplying a flexible substrate, which has a photosensitive agent applied thereon;
   a guide unit adapted to continuously guide the substrate, which is supplied from said supply unit;
   a light source for irradiating beams on a section of the substrate;
   a mask positioned between the substrate, which is guided by said guide unit, and said light source so that the beams are selectively transmitted to the photosensitive agent; and
   a winding unit for collecting and winding the substrate, which has been subject to exposure as it passes by said guide unit,
   wherein said guide unit has a curved surface formed at least from a point at which the substrate contacts said guide unit from a supply unit side to a point at which the substrate is irradiated,
   wherein said guide unit has a flat surface formed in a predetermined region from the point at which the substrate is irradiated to a point at which the substrate leaves said guide unit to travel to said winding unit.

11. The patterning apparatus according to claim 10, wherein said guide unit is fixed in its location.

12. The patterning apparatus according to claim 10, wherein the substrate is subject to exposure as it passes by a top point of said guide unit.

13. The patterning apparatus according to claim 10, wherein a vertical section of the substrate is subject to exposure as it passes by a top point of said guide unit.

14. The patterning apparatus according to claim 10, wherein said guide unit and said mask are installed on a frame.

15. The patterning apparatus according to claim 14, further comprising:
   an alignment controller unit for controlling an alignment of said mask.

16. The patterning apparatus according to claim 14, further comprising:
   an guide unit adjustment unit for controlling a position of said guide unit.

17. A method of pattering a flexible substrate, comprising:
   supplying a flexible substrate, which has a photosensitive agent applied on a surface of the substrate.
   guiding the flexible substrate to pass a curved portion of a guide unit;
   operating a light source to emit light beams;
   passing the light beams through a mask; and
   irritating the light beams, passing through the mask, onto the photosensitive agent of the substrate, as the flexible substrate passes by the curved portion of the guide unit,
   wherein said step of irritating the light beams onto the photosensitive agent of the substrate occurs as the flexible substrate passes over a top point of the guide unit,
   wherein a vertical section of the photosensitive agent and the substrate is irradiated, and the light beams are irradiated in a direction approximately perpendicular to the vertical section.

18. The method according to claim 17, further comprising collecting the irradiated flexible substrate in a winding unit.

19. The method according to claim 17, wherein the mask is positioned parallel to the vertical section.

20. The method according to claim 17, wherein a period of time during which the beams are irradiated on the photosensitive agent, and the amount of irradiation are determined by a speed control unit, which guides and moves the flexible substrate.

* * * * *